(12) United States Patent
Feng et al.

(10) Patent No.: US 9,704,737 B2
(45) Date of Patent: Jul. 11, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Chao-Hung Lin, Changhua County (TW); Shih-Fang Hong, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 34 days.

(21) Appl. No.: 14/816,081

(22) Filed: Aug. 3, 2015

(65) Prior Publication Data

US 2017/0005102 A1    Jan. 5, 2017

(30) Foreign Application Priority Data

Jul. 1, 2015  (TW) .............................. 104121285 A

(51) Int. Cl.
*H01L 21/00* (2006.01)
*H01L 21/762* (2006.01)
*H01L 27/11* (2006.01)
*H01L 27/092* (2006.01)
*H01L 21/8238* (2006.01)

(52) U.S. Cl.
CPC .................. *H01L 21/76229* (2013.01); *H01L 21/823821* (2013.01); *H01L 27/0924* (2013.01); *H01L 27/1104* (2013.01)

(58) Field of Classification Search
CPC ........... H01L 27/1116; H01L 21/76229; H01L 21/823821; H01L 27/0924; H01L 27/1104
See application file for complete search history.

(56) References Cited

U.S. PATENT DOCUMENTS

| | | | |
|---|---|---|---|
| 8,426,923 B2 | 4/2013 | Lee et al. | |
| 9,093,496 B2* | 7/2015 | Jacob | ................ H01L 21/76243 |
| 2011/0089526 A1 | 4/2011 | Lee et al. | |
| 2014/0065832 A1* | 3/2014 | Hsieh | .................. G03F 7/70683 438/703 |
| 2014/0273369 A1* | 9/2014 | Wei | ................ H01L 21/823821 438/232 |
| 2015/0021690 A1* | 1/2015 | Jacob | ................ H01L 21/02532 257/347 |
| 2015/0024572 A1* | 1/2015 | Jacob | ................ H01L 21/76243 438/404 |
| 2015/0076610 A1* | 3/2015 | Ito | .......................... H01L 29/785 257/365 |
| 2015/0279959 A1* | 10/2015 | Qi | .................... H01L 21/823431 438/585 |
| 2016/0133726 A1* | 5/2016 | Sung | ................. H01L 29/66795 438/283 |

* cited by examiner

*Primary Examiner* — Nicholas Tobergte
(74) *Attorney, Agent, or Firm* — Winston Hsu

(57) ABSTRACT

A method for fabricating semiconductor device is disclosed. The method includes the steps of: providing a substrate having a first region, a second region, and a third region; forming a plurality of spacers on the first region, the second region, and the third region; forming a first patterned mask to cover the spacers on the first region and the second region; and removing the spacers on the third region.

6 Claims, 7 Drawing Sheets

US 9,704,737 B2

SEMICONDUCTOR DEVICE AND METHOD FOR FABRICATING THE SAME

BACKGROUND OF THE INVENTION

1. Field of the Invention

The invention relates to a method for fabricating field effect transistor, and more particularly to a method of fabricating planar field effect transistor, fin field effect transistor (FinFET), and static random access memory (SRAM) on a substrate.

2. Description of the Prior Art

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (Fin FET) have three-dimensional structure, not only capable of increasing the contact to the gate but also improving the controlling of the channel region, such that the non-planar FETs have replaced the planar FETs and become the mainstream of the development.

The current method of forming the Fin FETs is forming a fin structure on a substrate primary, and then forming a gate on the fin structure. The fin structure generally includes the stripe-shaped fin formed by etching the substrate. However, under the requirements of continuous miniaturization, the width of each fin, as well as the pitch between fins have to be shrunk accordingly. Thus, the fabricating process of the Fin FETs also faces more challenges and limitations. For example, the fabricating process is limited by current mask and lithography techniques, such that it has problems to precisely define the position of the fin structure, or to precisely control the etching time, thereby leading to the fin collapse or over-etching issues, and seriously affecting the efficiency of the fin structure.

SUMMARY OF THE INVENTION

According to a preferred embodiment of the present invention, a method for fabricating semiconductor device is disclosed. The method includes the steps of: providing a substrate having a first region, a second region, and a third region; forming a plurality of spacers on the first region, the second region, and the third region; forming a first patterned mask to cover the spacers on the first region and the second region; and removing the spacers on the third region.

According to another aspect of the present invention, a semiconductor device includes: a substrate having a first region and a second region; a first base on the first region and a second base on the second region; a plurality of first fin-shaped structures on the first base; a single second fin-shaped structure on the second base; a first shallow trench isolation (STI) between the first fin-shaped structures and the second fin-shaped structure; and a second STI adjacent to the second fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
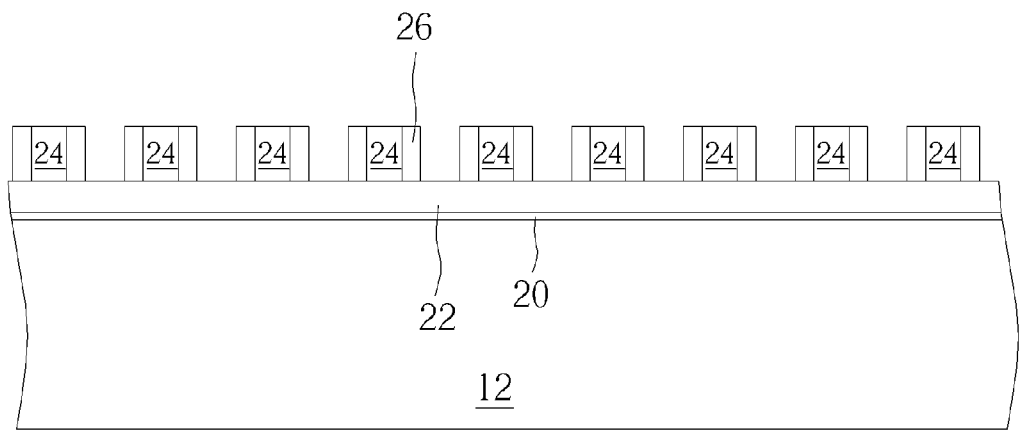
FIGS. 1-7 illustrate a method for fabricating semiconductor device according to a first embodiment of the present invention.

Referring to FIGS. 1-7, FIGS. 1-7 illustrate a method for fabricating semiconductor device according to a first embodiment of the present invention. As shown in FIG. 1, a substrate 12, such as silicon substrate is provided, and a first region 14, a second region 16, and a third region 18 are defined on the substrate 12. Preferably, the first region 14, second region 16, and third region 18 are used to fabricate different types of semiconductor devices in the later process, in which the first region 14 in this embodiment is preferably serving as a logic region for fabricating FinFET devices, the second region 16 is serving as a memory region for fabricating SRAM devices, and the third region 18 is used for fabricating planar MOS transistors.

Next, a pad oxide 20, a pad nitride 22, and a material layer (not shown) are formed on the substrate 12, and a sidewall image transfer (SIT) technique is conducted to form a plurality of spacers on the pad nitride 22. For instance, a photo-etching process could be conducted by first forming a patterned resist on the material layer, and then conducting an etching process by using the patterned resist as mask to remove part of the material layer for forming a plurality of mandrels 24 on the pad nitride 22. Next, a cap layer is formed on the mandrels 24 and pad nitride 22, and an etching back is conducted to remove part of the cap layer to form spacers 26 on the first region 14, second region 16, and third region 18.

Figure 2:
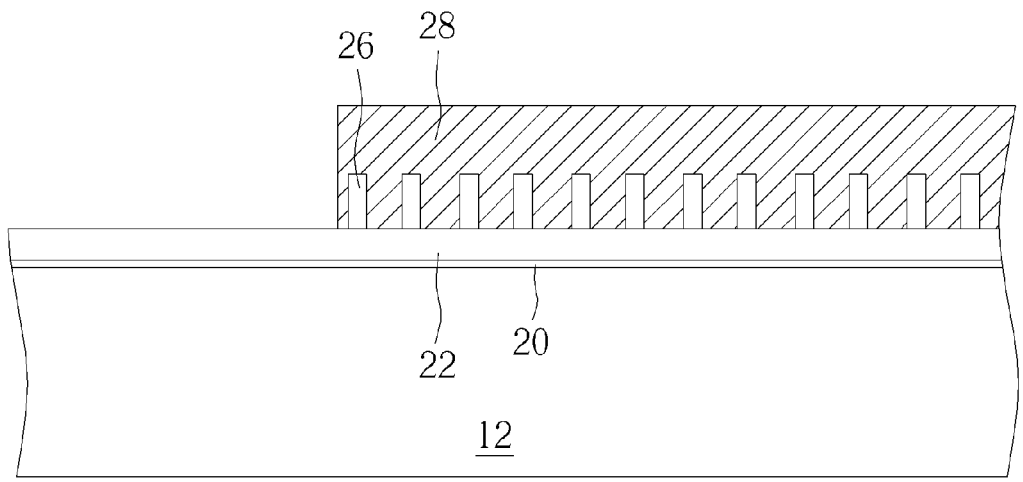

Next, as shown in FIG. 2, after removing all of the mandrels 24, a first patterned mask 28 is formed to cover the spacers 26 on the first region 14 and second region 16, and an etching process is conducted by using the first patterned mask 28 as mask to remove all of the spacers 26 on third region 18 for exposing the surface of the pad nitride 22.

Figure 3:
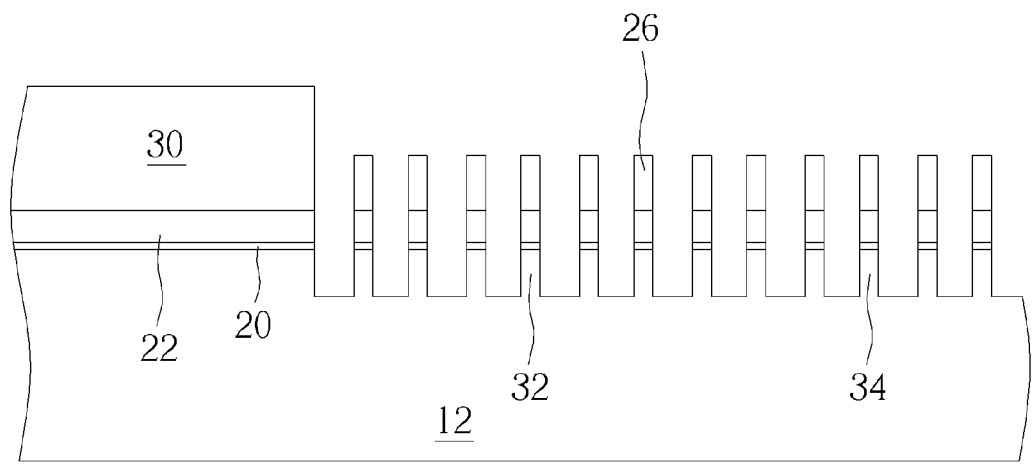

After removing the first patterned mask 28, as shown in FIG. 3, a second patterned mask 30 is formed on the third region 18, and an etching process is conducted by using the second patterned mask 30 and the spacers 26 on first region 14 and second region 16 as mask to remove part of the substrate 12 on first region 14 and second region 16 for forming a plurality of first fin-shaped structures 32 on first region 14 and a plurality of second fin-shaped structures 34 on second region 16.

Figure 4:
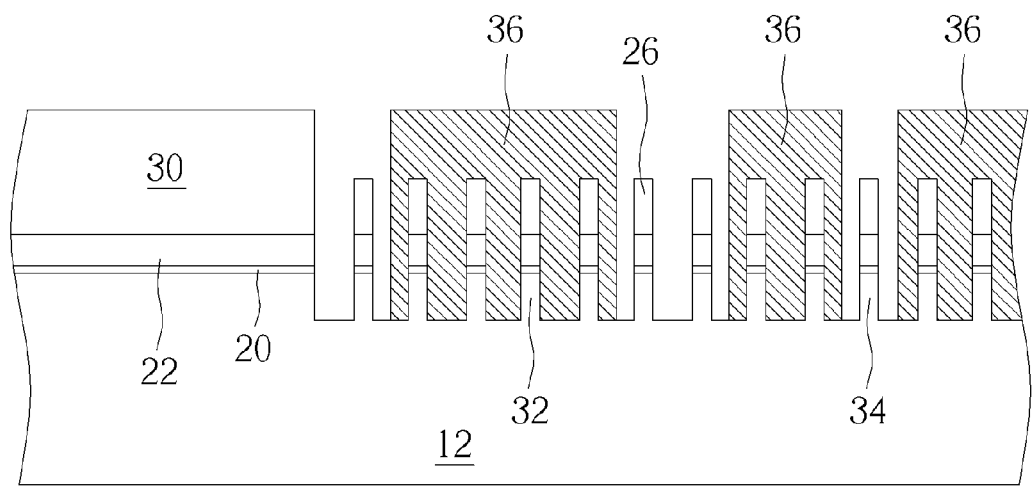

Next, as shown in FIG. 4, a third patterned mask 36 is formed on part of the first fin-shaped structures 32 and part of the second fin-shaped structures 34.

Figure 5:
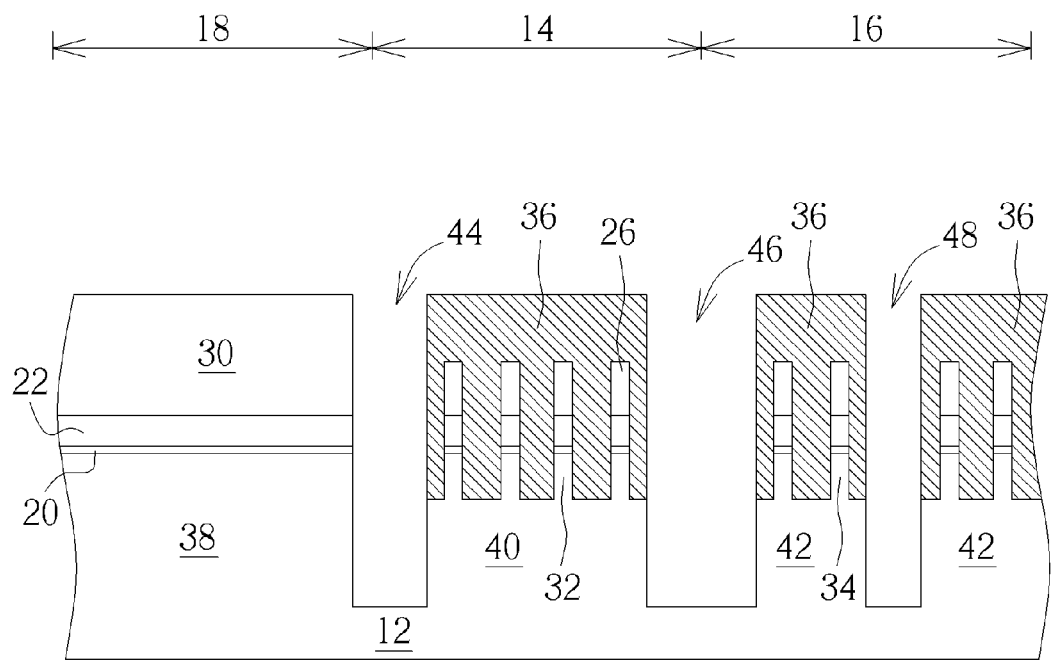

Next, as shown in FIG. 5, an etching process is conducted by using the second patterned mask 30 and third patterned mask 36 as mask to remove the spacers 26, pad nitride 22, pad oxide 20, first fin-shaped structures 32, and second fin-shaped structures 34 not covered by the second patterned mask 30 and third patterned mask 36, and then continuing using the second patterned mask 30 and third patterned mask 36 to remove part of the substrate 12 underneath for forming a first base 38 on the third region 18, a base 40 under the first fin-shaped structures 32, a plurality of bases 42 under the second fin-shaped structures 34, a trench 44 between the base 38 and base 40, a trench 46 between the base 40 and base 42, and a trench 48 between the bases 42. It should be noted that a plurality of fin-shaped structures are still disposed on the base 40 on first region 14 and the bases 42 on second region 16 respectively. For instance, four first fin-shaped structures 32 are disposed on the base 40 and two second fin-shaped structures 34 are disposed on each of the bases 42.

Figure 6:
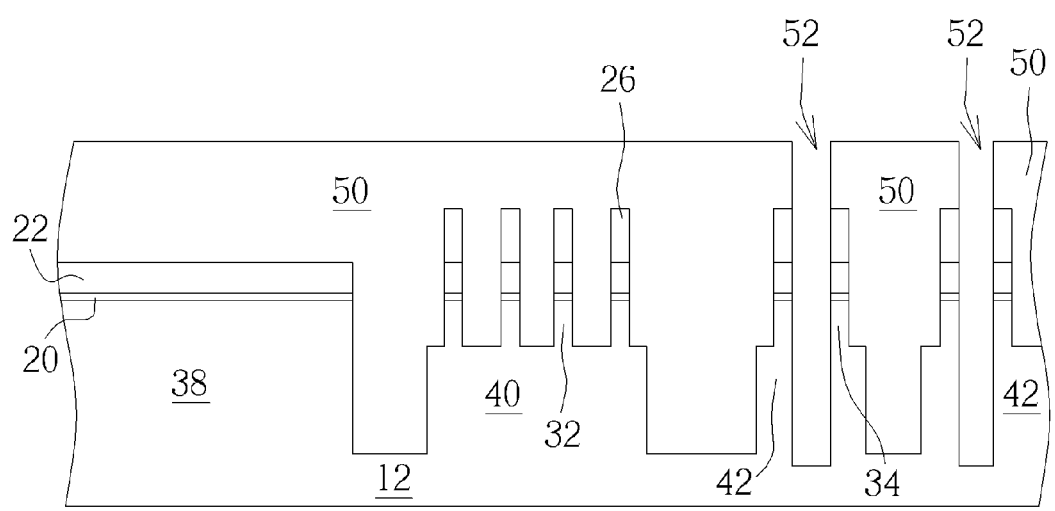

Next, as shown in FIG. 6, the second patterned mask 30 and third patterned mask 36 are removed and a fourth patterned mask 50 is formed on the third region 18, the first region 14, and the second fin-shaped structures 34 on second region 16. An etching process is then conducted by using the fourth patterned mask 50 as mask to remove part of the base 42 on second region 16 to divide the original base 42 into two parts while forming another trench 52 between the second fin-shaped structures 34. It should be noted that at this point a plurality of first fin-shaped structures 32 are still disposed on the base 40 on first region 14 while only a single second fin-shaped structure 34 is disposed on each base 42 on second region 16.

Figure 7:
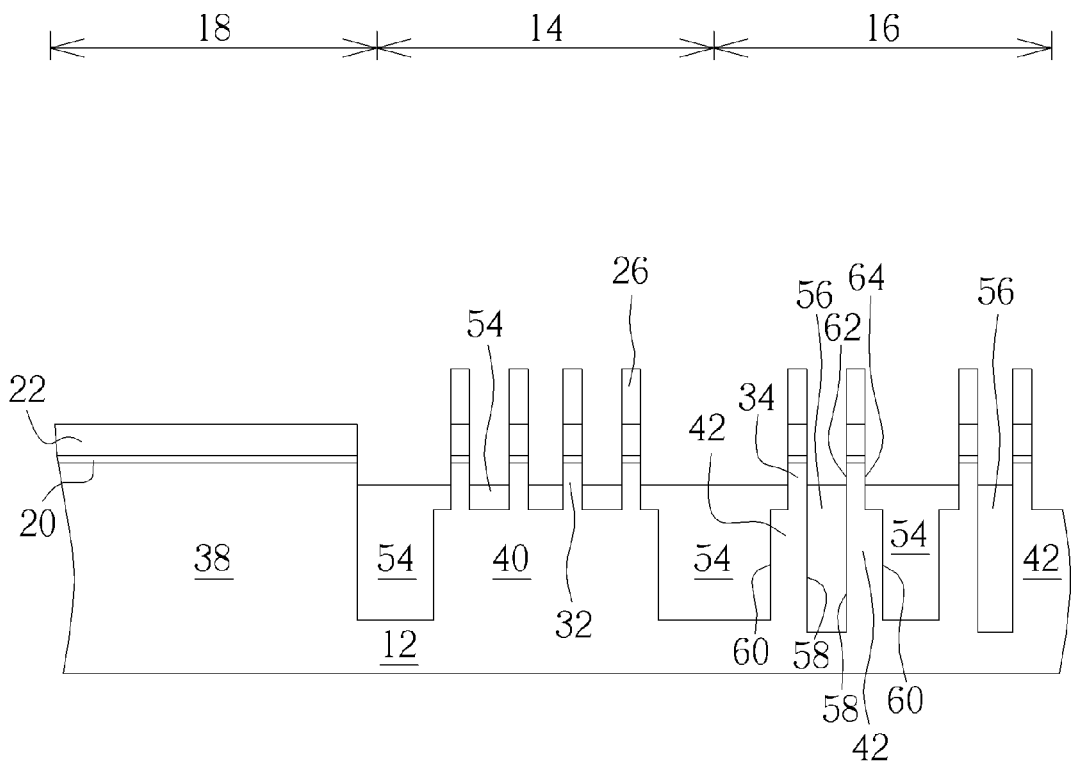

After removing the fourth patterned mask 50, as shown in FIG. 7, a shallow trench isolation (STI) fabrication is conducted by first depositing an insulating layer (not shown) composed of silicon oxide on the substrate 12 and fill the trenches 44, 46, 48, 52 between the bases 38, 40, 42, and then planarizing part of the insulating layer and removing part of the insulating layer by etching back process to form a plurality of STIs 54 between the first fin-shaped structures 32 and second fin-shaped structure 34 and STI 56 in the trench 52 between bases 42. Next, spacers 26, pad nitride 22, and pad oxide 20 could be removed depending on the demand of the process and gate structures could be formed on each fin-shaped structure and bases 38, 40, 42, and fabrication of active devices could be conducted thereafter to form FinFET, SRAM, and planar MOS transistors on first region 14, second region 16, and third region 18 respectively. This completes the fabrication of a semiconductor device according to a first embodiment of the present invention.

Referring again to FIG. 7, a semiconductor device structure is further disclosed, which preferably includes a base 40 disposed on the first region 14 of a substrate 12, at least a base 42 disposed the second region 16, a base 38 disposed on the third region 18, a plurality of first fin-shaped structures 32 disposed on the base 40, a single second fin-shaped structure 34 disposed on each base 42, STI 54 disposed between the first fin-shaped structures 32 and second fin-shaped structure 34, and STI 56 between the bases 42.

In this embodiment, the bases 38, 40, 42, first fin-shaped structures 32, and second fin-shaped structures 34 all composed of same material, such as all being composed of single crystal silicon. In addition, the top surface of the base 38 on third region 18 is preferably higher than the top surfaces of the base 40 on first region 14 and the base 42 on second region 16, and the top surface of the base 40 is preferably even with the top surface of the base 42. The depths of the STI 54 and STI 56 are preferably different, in which the depth of the STI 54 between the bases 40 and 42 is approximately 840 Angstroms, the depth of the STI 54 on top of the base 40 is about 140 Angstroms, and depth of the STI 56 between bases 42 is about 1400 Angstroms.

Viewing from the second region 16, each of the bases 42 includes a sidewall 58 and sidewall 60 and the second fin-shaped structure 34 on top of each base 42 also includes a sidewall 62 and a sidewall 64, in which the sidewall 58 of the base 42 is preferably aligned with the sidewall 62 of the second fin-shaped structure 34 and the other sidewall 60 of the base 42 is not aligned with the sidewall 64 of the second fin-shaped structure 34.

Figure 8:
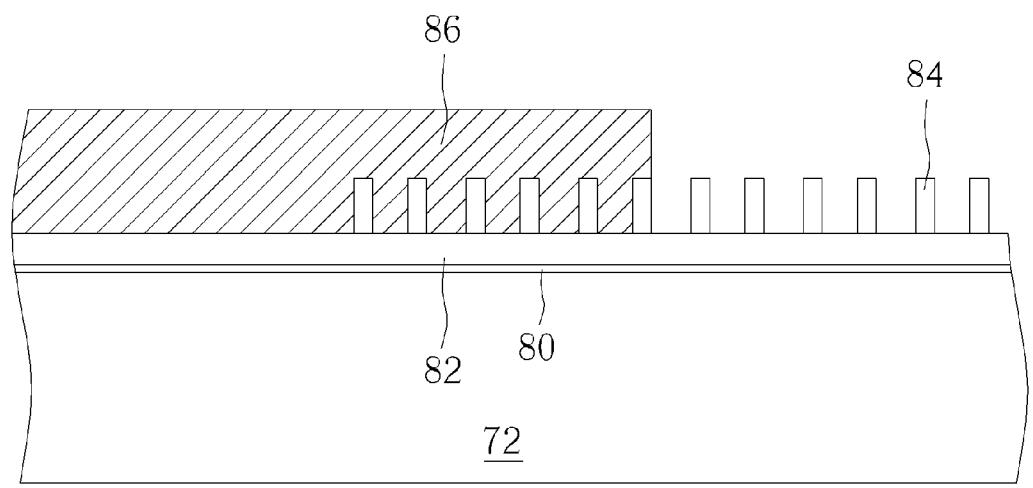
FIGS. 8-11 illustrate a method for fabricating semiconductor device according to a second embodiment of the present invention.

Referring to FIGS. 8-11, FIGS. 8-11 illustrate a method for fabricating semiconductor device according to a second embodiment of the present invention. As shown in FIG. 8, a substrate 72, such as silicon substrate is provided, and a first region 74, a second region 76, and a third region 78 are defined on the substrate 72. Preferably, the first region 74, second region 76, and third region 78 are used to fabricate different types of semiconductor devices in the later process, in which the first region 74 in this embodiment is preferably serving as a logic region for fabricating FinFET devices, the second region 76 is serving as a memory region for fabricating SRAM devices, and the third region 78 is used for fabricating planar MOS transistors.

Next, a pad oxide 80 and a pad nitride 82 are formed on the substrate 72, and the SIT process conducted from FIGS. 1-2 is carried out to form a plurality of spacers 84 on the first region 74, second region 76, and third region 78. Next, a first patterned mask (not shown) is formed to cover the spacers 84 on first region 74 and second region 76, and an etching process is conducted by using the first patterned mask to remove all of the spacers 84 on third region 78 and expose the pad nitride 82 surface. After removing the first patterned mask, a second patterned mask 86 is formed on the first region 74 and third region 78.

Figure 9:
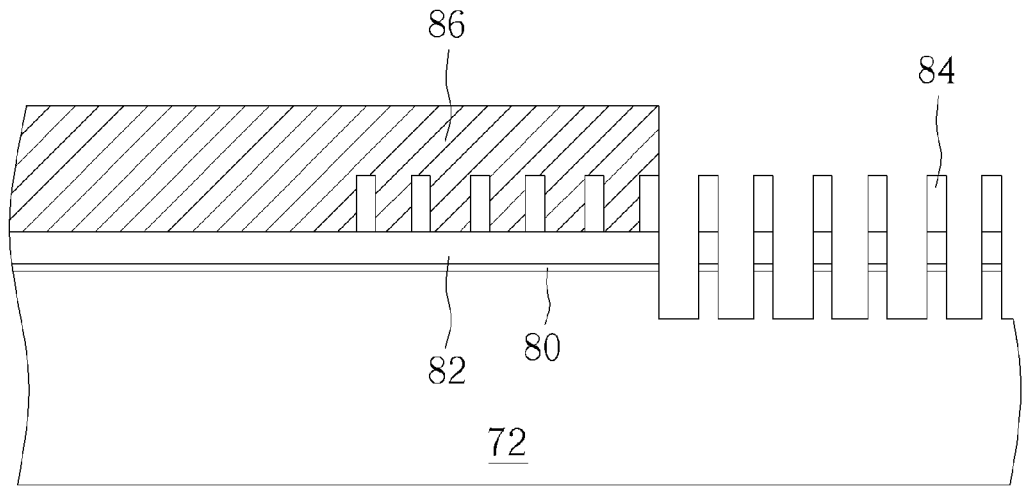

Next, as shown in FIG. 9, an etching process is conducted by using the second patterned mask 86 as mask to remove part of the substrate 72 on second region 76.

Figure 10:
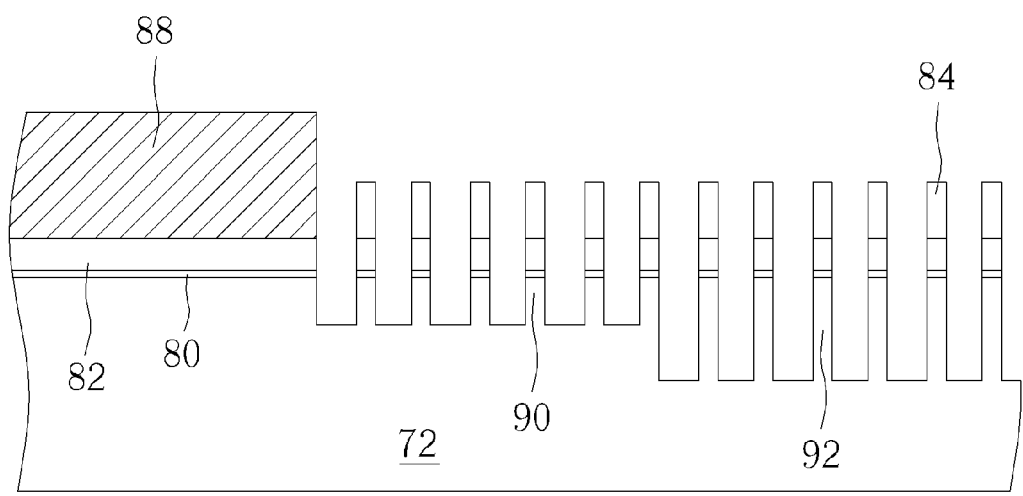

After removing the second patterned mask 86, as shown in FIG. 10, a third patterned mask 88 is formed on the third region 78, and an etching process is conducted by using the third patterned mask 88 as mask to remove part of the substrate 72 on first region 74 and second region 76 for forming a plurality of first fin-shaped structures 90 and second fin-shaped structures 92. Preferably, the top surface of the first fin-shaped structure 90 and second fin-shaped structures 92 are coplanar while the height of the second fin-shaped structures 92 is preferably higher than the height of the first fin-shaped structures 90.

Figure 11:
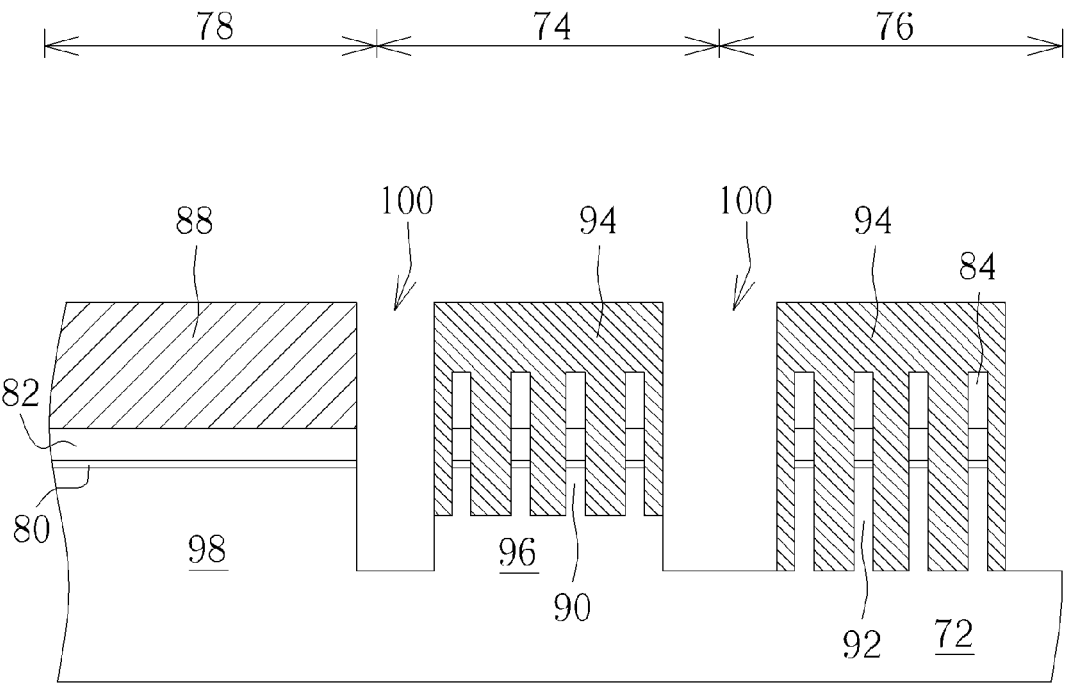

Next, as shown in FIG. 11, a fourth patterned mask 94 is formed on part of the first fin-shaped structures 90 on first region 74 and part of the second fin-shaped structures 92 on second region 76, and one or more etching process is conducted to remove the spacer 84, pad nitride 82, pad oxide 80, part of the first fin-shaped structures 90, and part of the second fin-shaped structures 92 not covered by the fourth patterned mask 94. The etching process is then continued by using the fourth patterned mask 94 to remove part of the substrate 72 for forming a base 96 under the first fin-shaped structures 90, a base 98 on third region 78, and trenches 100 between first fin-shaped structures 90 and second fin-shaped structures 92 and between bases 96 and 98, in which the bottom of the trenches 100 is preferably even with the bottom of the second fin-shaped structures 92. Next, a STI fabrication process from FIG. 7 could be conducted to form STI structures in the trenches 100 and between first fin-shaped structures 90 and second fin-shaped structures 94, and the details of which are not explained herein for the sake of brevity.

Figure 12:
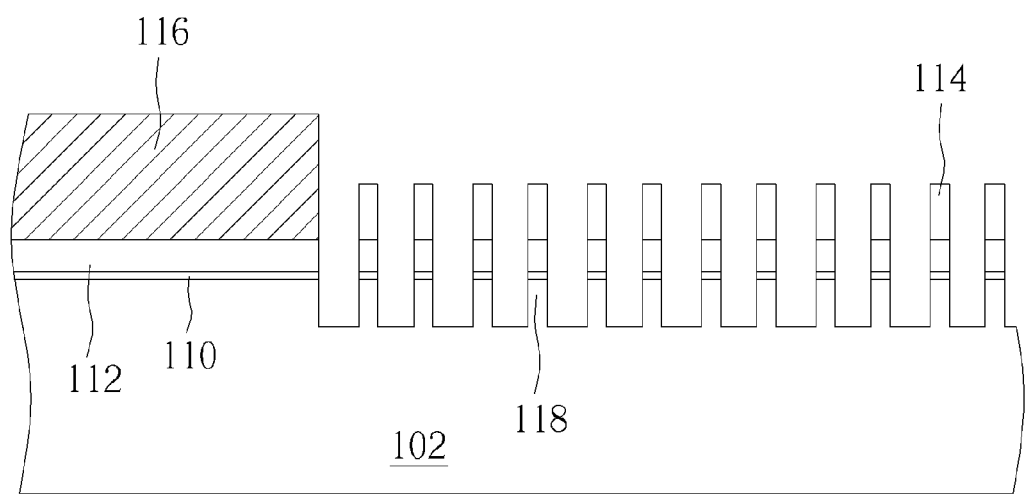
FIGS. 12-14 illustrate a method for fabricating semiconductor device according to a third embodiment of the present invention.
Figure 13:
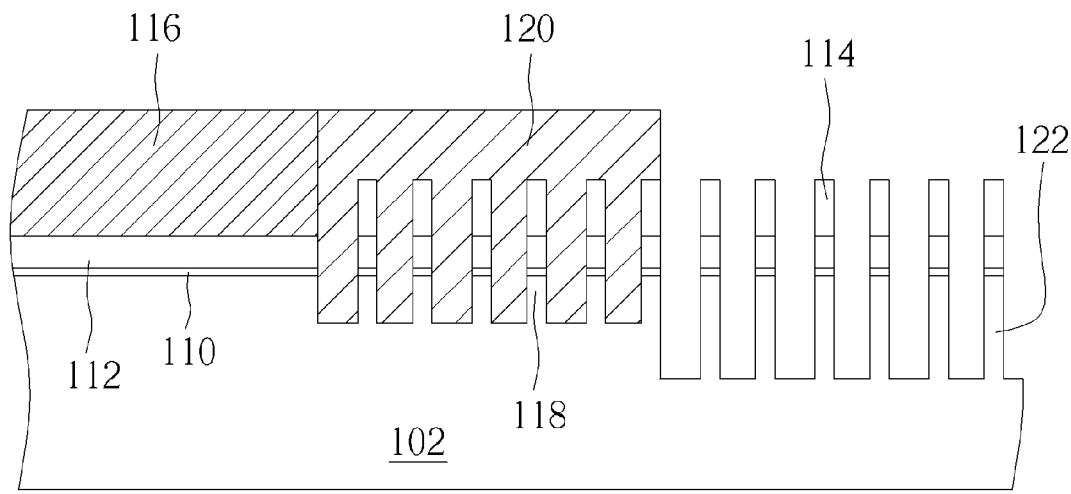
Figure 14:
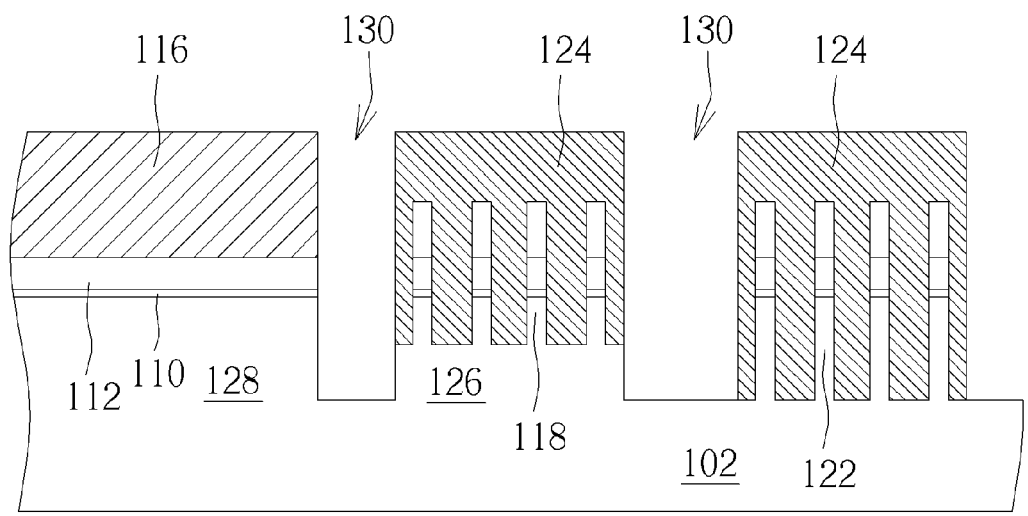

Referring to FIGS. 12-14, FIGS. 12-14 illustrate a method for fabricating semiconductor device according to a third embodiment of the present invention. As shown in FIG. 12, a substrate 102, such as silicon substrate is provided, and a first region 104, a second region 106, and a third region 108 are defined on the substrate 102. Preferably, the first region 104, second region 106, and third region 108 are used to fabricate different types of semiconductor devices in the later process, in which the first region 104 in this embodiment is preferably serving as a logic region for fabricating FinFET devices, the second region 106 is serving as a memory region for fabricating SRAM devices, and the third region 108 is used for fabricating planar MOS transistors.

Next, a pad oxide 110 and a pad nitride 112 are formed on the substrate 102, and the SIT process conducted from FIGS. 1-2 is carried out to form a plurality of spacers 114 on the first region 104, second region 106, and third region 108. Next, a first patterned mask (not shown) is formed to cover the spacers on first region 104 and second region 106, and an etching process is conducted by using the first patterned mask to remove all of the spacers 114 on third region 108 and expose the pad nitride 112 surface.

After removing the first patterned mask, a second patterned mask 116 is formed on the third region 108, and an etching process is conducted by using the second patterned mask 116 to remove part of the substrate 102 for forming a plurality of first fin-shaped structures 118 on first region 104 and second region 106.

Next, as shown in FIG. 13, a third patterned mask 120 is formed to cover the first fin-shaped structures 118 on first region 104, and an etching process is conducted by using the second patterned mask 116 and third patterned mask 120 as mask to remove part of the substrate 102 on second region 106 for forming a plurality of second fin-shaped structures 122.

Next, as shown in FIG. 14, after removing the third patterned mask 120, a fourth patterned mask 124 is formed on part of the first fin-shaped structures 118 on first region 104 and part of the second fin-shaped structures 122 on second region 106. Next, one or more etching process is conducted by using the second patterned mask 116 and fourth patterned mask 124 to remove the spacers 114, pad nitride 112, pad oxide 110, first fin-shaped structures 118, and second fin-shaped structures 122 not covered by the second patterned mask 116 and fourth patterned mask 124. The etching process is then continued to remove part of the substrate 102 for forming a base 126 under the first fin-shaped structures 118, abase 128 on third region 108, and trenches 130 between first fin-shaped structures 118 and second fin-shaped structures 122 and between bases 126 and 128, in which the bottom of the trenches 130 is preferably even with the bottom of the second fin-shaped structures 122. Next, a STI fabrication process from FIG. 7 could be conducted to form STI structures in the trenches 130 and between first fin-shaped structures 118 and second fin-shaped structures 122, and the details of which are not explained herein for the sake of brevity.

Overall, it would be desirable to employ the aforementioned processes to form different semiconductor devices on different regions of a substrate, such as forming a FinFET device on the logic region or first region 14, forming a SRAM device on the memory region or second region 16, and forming a planar MOS transistor on the third region 18. According to the aforementioned first embodiment, a plurality of fin-shaped structures are formed on the base on first region, only a single fin-shaped structure is formed on each base on second region, and only a base without any fin-shaped structure is formed on third region. Moreover, the depths of the STIs on first region and second region are also different from the depth of the STI on second region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having a first region, a second region, and a third region;
    a first base on the first region and a second base on the second region;
    a plurality of first fin-shaped structures on the first base;
    a single second fin-shaped structure on the second base, wherein a sidewall of the single second fin-shaped structure is aligned with a sidewall of the second base;
    a first shallow trench isolation (STI) between the first fin-shaped structures and the second fin-shaped structure;
    a second STI adjacent to the second fin-shaped structure; and
    a third base on the third region, wherein a top surface of the third base is higher than the top surfaces of the first base and the second base.

2. The semiconductor device of claim 1, wherein the substrate, the first base, the second base, the third base, the first fin-shaped structures, and the second fin-shaped structure comprise same material.

3. The semiconductor device of claim 1, wherein the first STI and the second STI comprise different depths.

4. The semiconductor device of claim 1, further comprising a third STI between the first base and the third base.

5. The semiconductor device of claim 4, wherein the top surfaces of the first STI, the second STI, and the third STI are coplanar.

6. The semiconductor device of claim 1, wherein a first sidewall of the second base is aligned with a second sidewall of the second fin-shaped structure and a third sidewall of the second base is not aligned with a fourth sidewall of the second fin-shaped structure.

* * * * *